United States Patent [19]
Depey

[11] 4,288,805
[45] Sep. 8, 1981

[54] INTEGRATED LOGIC GATE WITH NPN INVERTER, PNP CLAMP, COUPLING SCHOTTKY DIODES AND DIFFUSED CROSSUNDER

[75] Inventor: Maurice Depey, Paris, France
[73] Assignee: Thomson-CSF, Paris, France
[21] Appl. No.: 20,491
[22] Filed: Mar. 14, 1979

[30] Foreign Application Priority Data
Mar. 14, 1978 [FR] France ............................. 78 07279

[51] Int. Cl.³ .................. H01L 27/04; H03K 19/084; H03K 19/091
[52] U.S. Cl. ................................... 357/44; 307/458; 357/15; 357/46; 357/48; 357/92
[58] Field of Search .................... 357/92, 44, 46, 15; 307/213, 317 A

[56] References Cited
PUBLICATIONS
Lohstroh, IEEE J. of Solid-State Circuits, vol. SC 14, No. 3, Jun. 1979, pp. 585–590.
Berger et al., IBM Technical Disclosure Bulletin, vol. 20, No. 2, Jul. 1977, pp. 636–637.
Porter, IEEE J. of Solid State Circuits, vol. SC 12, No. 5, Oct. 1977, pp. 440–449.
Peltier, IEEE International Solid State Circuits Conf., Feb. 14, 1975, Digest of Technical Papers, pp. 168–169.
Electronics, Jun. 8, 1978, pp. 41–42.
Berger et al., "Merged Transistor Logic . . . ", IEEE J. of Solid-State Circuits, vol. SC 7, No. 5, Oct. 1972, pp. 340–346.

*Primary Examiner*—William D. Larkins
*Attorney, Agent, or Firm*—Cushman, Darby & Cushman

[57] ABSTRACT

A logic element structure suitable for high density integration including a vertical NPN transistor, a lateral PNP anti-saturation transistor, and a Schottky diode coupled to the collector of the NPN transistor and providing a logic element output. The logic element structure is fabricated as a monolithic integration on a semiconductor crystal and comprises an isolated region of N-type semiconductor material bounded on its inner principal face by a substrate and by a buried layer of N+ type material, the isolated region being further bounded on its lateral faces by an insulating wall of P-type semiconductor material and on its principal outer face by a first region of P-type semiconductor material, this first region of P-type semiconductor material at the periphery of the isolated region and partially covering the insulating wall, the isolated region being further bounded on its principal outer face by a second region of P-type semiconductor material insulated from the first region of P-type semiconductor material by a minimum thickness of N-type semiconductor material, this second region of P-type semiconductor material surrounding a second region of N+-type semiconductor material, the Schottky diode formed by a metallization on the principal outer face of the isolated region between the first and second P-type semiconductor regions.

18 Claims, 5 Drawing Figures

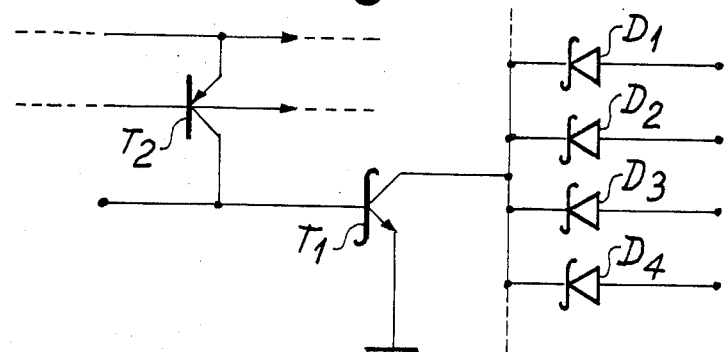
Fig_1 PRIOR ART
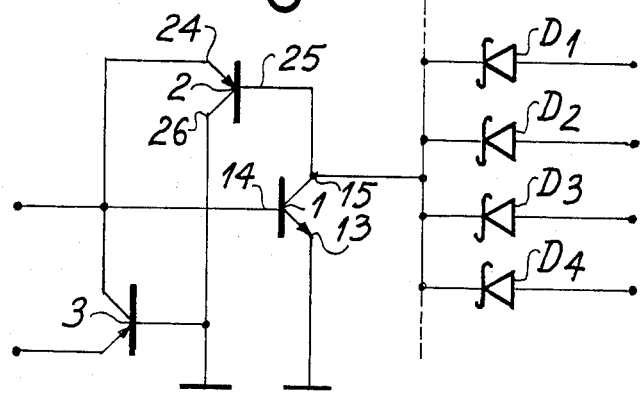
Fig_2 PRIOR ART
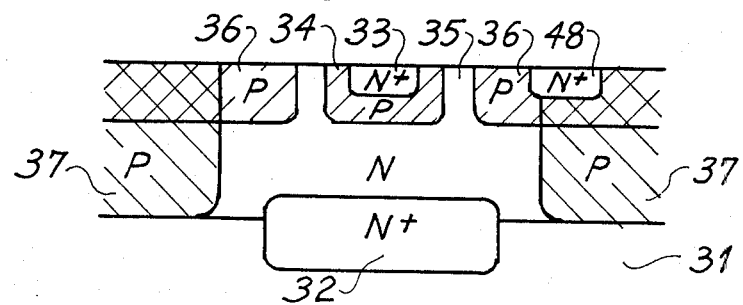
Fig_3

Fig_4
(a)
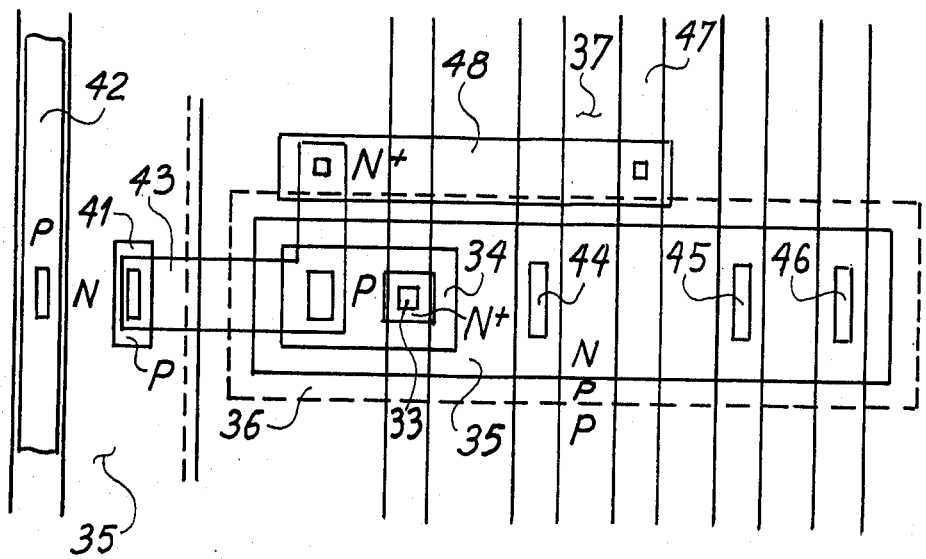
(b)
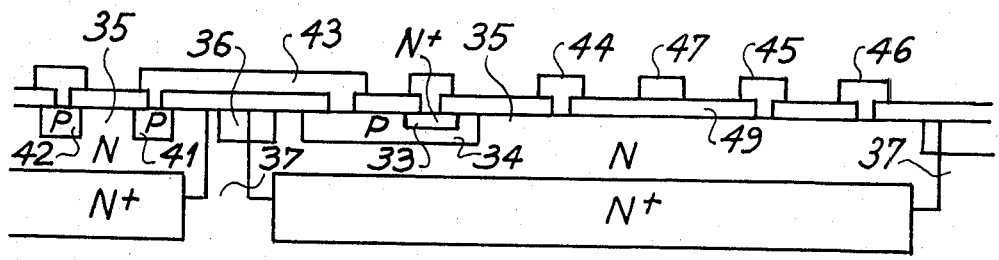

INTERGRATED LOGIC GATE WITH NPM INVERTER, PNP CLAMP, COUPLING SCHOTTKY DIODES AND DIFFUSED CROSSUNDER

This invention relates to electronic circuits and, more particularly, to so-called "logic" circuits which form a significant part of numerous hardward systems operating by means of electronic devices whose circuits are integrated on a semiconductor crystal. there is significant advantage in optimising each of the logic element structures integrated on a single semiconductor crystal in order to obtain the largest possible number of components, both active and passive, on the available surface of the crystal. This optimisation may be obtained in different ways, such as for example:

reducing the dimensions of the components;
reducing the safety gaps between components, these safety gaps being intended to prevent short-circuits between adjacent components;
and also, when possible,
matching the technology, for example by interconnections at several levels;
matching the circuits themselves either with a view to eliminating components or with a view to providing them with an architecture which, for the same function, provides for integration over a smaller area of the semiconductor.

In addition to this first consideration associated with the complexity and, hence, with the need to economise on the active surface for integrating a larger number of components, there is a second aspect of logic structure optimisation. This second aspect of optimisation is associated with the advantage of obtaining a high operating speed for each of the logic elements with a view to preventing the propagation time of a signal through each element multiplied by the number of components from reaching prohibitive levels. Since the propagation time of each active component is associated with its stored charge, various arrangements for logic elements have been attempted both from the point of technology used and from the point of view of the design of fast circuits.

Among the several possible circuit designs, there is one which is particularly effective. Described in particular by Porter (IEEE, Journal of Solid State Circuits, Vol. SC 12, No. 5, October 1977, pages 440 et seq), this design associates an NPN transistor and a PNP transistor. The NPN transistor is the conventional transistor of a logic operator, whilst the PNP transistor is arranged between the collector and base of the NPN transistor in order to reduce the stored charge when the NPN transistor is saturated by an excess of base current. Thus, in this arrangement, there is an ohmic connection between:

firstly, the collector of the NPN transistor and the base of the PNP transistor;
secondly, the base of the NPN transistor and the emitter of the PNP transistor;
thirdly, the emitter of the NPN transistor and the collecttor of the PNP transistor.

Since the two transistors are complementary types, this arrangement of their electrodes enables them to be combined in two in the semiconductor crystal. This results in a saving on surface area which provides for a greater integration density.

The present invention provides a novel logic element structure for implementing various circuit arrangements, such as taught by Porter, with a high integration density. The novel structure implements a circuit including an NPN transistor of which the emitter is common to the earth of the circuit and of which the outputs on the collector are formed by diodes of the Schottky type. The circuit further includes an anti-saturation PNP transistor of which the base is controlled by the collector of the first transistor, the collector of the second transistor being common to the earth of the circuit and the emitter connected to the base of the first transistor. The novel logic element structure implementing this circuit is a monolithic integration on a semiconductor crystal comprising an isolated region of a semiconductor material of N-type conductivity bounded on its principal inner face by the substrate and by a buried layer of N⁻-type conductivity, on its lateral faces by an insulating wall of P-type conductivity and on its principal outer face by a first zone of P-type conductivity, this zone occupying the periphery of the isolated region and partly covering the insulating wall, and by a second zone of P-type conductivity insulated from the first P-type zone by a minimal thickness of material of the N-type isolated region, this second P-type zone surrounding a second zone of N⁺-type conductivity, the logic operator being completed by Schottky diodes formed by suitable metallisations on the principal outer face of the isolated region between the two P-type zones.

The invention will be better understood from the following description in conjunction with the accompanying drawings, wherein:

FIG. 1 is a schematic diagram of one elementary logic element according to the prior art.

FIG. 2 is a schematic diagram of another elementary logic element according to the prior art.

FIG. 3 shows the integration structure according to the present invention of that part of the logic element comprising an NPN transistor and a PNP transistor.

FIG. 4 shows the integration structure according to the invention of a logic element identical with that shown in FIG. 2 in a plan view (FIG. 4a) and in section (FIG. 4b).

FIG. 1 is the circuit diagram of an operator of the type described by Arthur W. Peltier in an Article entitled "A new approach to bipolar LSI, C3L" published in the abstracts (1975, page 168) of the International Solid State Circuits Conference. It comprises an NPN transistor T1, a PNP transistor T2 serving as current source and multiple outputs formed by Schottky diodes D1 and D4 (the number of outputs not being limitative). The NPN transistor functions in the normal way, i.e. switches more rapidly than in so-called "I2L" (integrated injection logic) technology in which it functions upside down. However, in order to reduce or prevent saturation of the transistor T1, a Schottky diode is connected in parallel with its collector-base junction. Accordingly, the transistor T1 is a Schottky transistor.

The choice of a Schottky transistor is very effective for preventing direct passage into the collector-base junction of this NPN transistor, but has the disadvantage of preventing the collector-emitter voltage of the same transistor from assuming a very low value in the low output state which, to obtain satisfactory blockage of the following stage in a more complex circuit, requires low-threshold Schottky connecting diodes. The operations involved in production, particularly metallisation, are rendered more complex because it is necessary simultaneously to obtain on one and the same circuit Schottky diodes differing in nature according to their voltage-limiting or connecting function.

FIG. 2 is a circuit diagram of the logic element described by T. Porter in the Journal cited earlier on. A particular implantation of a logic element such as this on a semiconductor crystal is the subject of the present invention. The addition of a PNP transistor to the conventional NPN transistor with a common emitter reduces the stored charge when the NPN transistor is saturated by an excess of base current. In this case, there is only one type of Schottky diode and, since the collector-emitter voltage of the NPN transistor is limited to a lower value, the requirements on the forward voltage of the Schottky connecting dioded are far less stringent. It is true that the saturation of the NPN transistor is not completely eliminated in this case but, for a minimal loss of speed, the producion operations are considerably simplified. Thus, an a logic elements of this tye can be produced by a technological process entirely compatible with that used for the conventional Schottky TTL logic gates.

The logic element shown in FIG. 2 comprises an NPN transistor 1, a PNP anti-saturation transistor 2, Scottky diodes of which four, D1 to D4, have been shown, although the number of Schottky diodes is by no means limited to four, and a current source 3. These components are thus interconnected: the emitter 13 of the NPN transistor is connected to the earth of the circuit whilst its collector 15 is connected on the one hand to the Schottky diodes and on the other hand to the base 25 of the PNP anti-saturation transistor 2. The emitter 24 of the PNP anti-saturation transistor 2 is connected to the base 14 of the NPN transistor, whilst its collector is connected to the earth of the circuit. The current source may be formed by a resistance in series with the feed voltage of the circuit, although it is preferably formed by a PNP transistor 3 of which the base is connected to earth or to a positive biassing voltage of low value (a few hundred millivolts) generated at the level of each operator or common to all the operators. The collector of this PNP current source is connected to the base of the NPN and a feed voltage common to several operators is applied to the emitter of the PNP current source, as is well known in I²L. According to the structure of the present invention all the connections are direct connections without any resistances which means that, in practice, a junction between two regions in the semiconductor crystal assumes one function for a transistor of one type and another function for a transistor of another type. This will be seen more clearly by referring to FIG. 3.

FIG. 3 is a section through the structure according to the present invention of part of an integrated circuit on a pellet of semiconductor crystal, this part comprising the NPN transistor 1 and the PNP transistor 2. A more complete section comprising the feed transistor and the Schottky diodes is shown in FIG. 4 which will be described later on.

The section of FIG. 3 shows a well limited in depth by the substrate 31 and a buried layer 32 of N+-type conductivity and by an insulating wall 37 of P-type conductivity surrounding the well. The well is occupied by a semiconductor material 35 of N-type conductivity on the surface of which two P-type regions have been diffused, their diffusion depth being less than that of the well. The region 36 is in contact with and covers the insulating wall 37 so that it surrounds the region 35, whilst the region 34 is situated at the centre of the upper surface of this same region 36. Finally, a region 33 of N+-type conductivity is diffused inside the P-type region 34.

In this arrangement, the emitter-base junction (34-35) of the PNP transistor is merged with the collector-base junction of the NPN transistor. Accordingly, the PNP transistor only becomes active when the collector-base diode of the NPN is biassed in the forward direction, i.e. when the NPN is saturated. The collector 36 of the PNP transistor is connected to the insulating wall 37 and, hence, to the substrate 31 and to the earth of the circuit so that, when the PNP transistor is active, it diverts to earth part of the excess current supplied to the base 34 of the NPN transistor. Finally, the emitter-base junction of the NPN transistor is formed by the junction between the regions 33 and 34. Accordingly, the NPN transistor is formed by an emitter 33, a base 34 and a collector 35, whilst the PNP transistor is formed by an emitter 34, a base 35 and a collector 36.

Accordingly, the PNP transistor is of the lateral type which is very important because the regions 34 and 36 (emitter and collector) of the PNP transistor are formed during one and the same diffusion operation. The automatic positioning of these two regions following a single masking operation enables them to be disposed at a narrow interval apart from one another, but with precision, and the narrow width of the base 35 of the PNP transistor gives it a high conductance and, hence, a high gain which is favourable to the required effect of reducing the charge stored in the collector of the NPN transistor for a given base current.

The function of the N+-type region 48 will be explained hereinafter with reference to FIG. 4.

The logic element shown in FIG. 2 which uses this structure additionally comprises Schottky diodes formed on the collector region 35 of the NPN transistor by weakly doped N-type metal-silicon contacts and a feed transistor of the PNP type. The logic element thus defined is a simple inverter of which the outputs formed by Schottky diodes are electrically independent when the NPN transistor is blocked. By connecting the outputs of two identical logic elements, an AND function is obtained, as is well known in I2L technology.

FIG. 4 shows a logic element of this type integrated on a monocrystal in the structure according to the invention. The architecture of the operator is shown in a plan view in FIG. 4a and in section in FIG. 4b. The various parts are so disposed as to facilitate the combination of several identical logic elements on the surface of one and the same crystal. In the illustration shown in FIG. 4a, other logic elements would be present above and below the logic element illustrated in the plane of the Figure, being generally fed by a bus line.

In FIG. 4a, the NPN transistor is formed by the same regions as in FIG. 3, i.e. the emitter 33, the base 34 and the collector 35, whilst the PNP anti-saturation transistor is formed by the emitter 34, the base 35 and the collector 36. The PNP feed transistor (reference 3 in FIG. 2) is formed in the same N-type epitaxial layer 35 as that which fills the inner well up to the insulating wall 37. A first diffused region 41 of P-type conductivity forms the collector of this feed transistor which is connected to the base 34 of the NPN and to the emitter 34 of the anti-saturation PNP by a surface metallisation 43, whilst a second diffused region 42 of P-type conductivity forms the emitter of this feed transistor. By virtue of the structure of the logic element, which is designed to be repeated on the surface of a crystal, the region P of the emitter 42 is in the form of a groove parallel to one small side of the logic element, whilst its surface metallisation is a band intended to supply as many feed transistors as there are logic elements on the integrated circuit.

Schottky diodes formed by the contact between a metal and the N-type collector region 35 of the NPN transistor complete the logic element. Three of these diodes 44, 45 and 46 have been shown although they may vary in number. These diodes are connected to those of the adjacent logic elements by metallisation bands.

The base 34 of the NPN transistor has to be accessible both from the collector 41 of the PNP feed transistor and from the connection of the signal 47 coming from the outputs of the logic elements controlling this base. According to the complexity and the architecture of the circuit, there may occasionally arise problems of topology, such as that shown in FIG. 4, where the control signal connection 47 is situated between two metallisation bands of Schottky diodes 44 and 45. The solution generally adopted for combining one metallisation 43 with another metallisation 47 is to shape the intermediate metallisations by means of a metallic interconnection having several insulating layers of a material such as silica separating two levels of metallic interconnections.

Another solution which forms part of the invention is to form a diffused N+-type region 48 of the same nature as the emitter of the NPN transistor in the P-type insulating wall 37 which separates two adjacent operators. Since this P-type region is widened in the vicinity of the surface by the collector region 36 of the PNP anti-saturation transistor. The insertion of this diffused crossing does not require any increase in the distance between operators. It is thus possible to associate operators to form a complex logic function without modifying the technological process because there is no recourse to a double layer of metallic interconnections, although a high integration density is strengthened by the fact that the connections pass through the thickness of the insulating walls and not over the surface, as is normally the case.

An insulating layer 49 of a material, such as an oxide or nitride of silicon for example, is deposited on the surface of the integrated circuit. This layer appears fragmented in FIG. 4b because it supports and insulates the metallic connections which, through it, establish the electrical contact with the underlying layers at the selected places.

An integrated circuit such as this is produced by the sequence of operations described hereinafter. Starting with a wafer of a monocrystalline semiconductor material, such as silicon, which acts as substrate (31), a buried layer of N+-type conductivity (32) is formed either by thermal diffusion or by the implantation of antimony or arsenic ions, ion implantation being preferred for its more reproducible results. At this stage, the buried layer is still coplanar with the substrate. It is only during the subsequent operations that if diffuses into the adjacent layer to assume an intermediate position between two layers, as illustrated in FIG. 3.

An N-type layer (35) of monocrystalline silicon is deposited on this substrate by epitaxy, the insulating walls (37) being subsequently diffused into this layer after masking. The P-type conductivity of the insulating walls is obtained by a doping impurity, such as boron.

After a second adequate masking operation, the same type of diffusion with boron as the doping impurity is repeated to from the P-type surface zones, i.e. the zones 34 and 36. Since the region 34 is the emitter of the PNP anti-saturation transistor and the region 36 is the collector of this transistor, it is a major advantage of the invention that these two regions are simultaneously formed because their automatic positioning very close to one another during a single masking operation makes it possible to obtain a base of very narrow width and, hence, a high conductance for the base, a high gain for the transistor and a high saturation speed for the operator.

The N+-type emitter region (33) of the NPN transistor and the N+-type groove (48) in the insulating wall (37) are formed during the subsequent production step by a single operation of diffusion or implantation of phosphorus or arsenic ions. The circuit as a whole is then covered with an insulating layer (49) of a material such as silica. An etching operation enables the silica to be removed at the contact points, such as the electrodes of the transistors or those of the future Schottky diodes. Finally, the last operation consists in depositing and then etching a metallisation which simultaneously forms the Schottky diodes (44, 45, 46) and the electrical connections and interconnections.

In conclusion, the original architecture of this operator which is adapted to a conventional production technology, i.e. so-called "Schottky" TTL logic, provides for a greater integration density because the operator is more compact than the internal TTL-LS operator for the same power consumption, although the resulting logic is faster than the "I2L" logic.

As a non-limiting example of the invention, the mean propagation time through a gate is of the order of 10 nanoseconds for a consumed current of 100 $\mu$A at 1.5 V, i.e. a merit factor of 1.5 picojoules.

With an interval of 20 micrometers between the metallisations and taking into account the geometric limits imposed by the bipolar technologies available at the present time, the surface occupied by a four-output operator, such as that which has been used as an example throughout this description, is of the order of 8000 $\mu$m$^2$, i.e. an integration density of approximately 120 operators per mm$^2$.

With an interval of 20 micrometers between the metallisations and taking into account the geometric limits imposed by the bipolar technologies available at the present time, the surface occupied by a four-output operator, such as that which has been used as an example throughout this description, is of the order of 8000 $\mu$m$^2$, i.e. an integration density of approximately 120 operators per mm$^2$.

What I claim is:

1. A logic element structure suitable for high density integration including:
    a first NPN transistor having an emitter coupled to circuit ground, a collector and a base;
    a Schottky diode coupled to said collector of said first transistor for providing a logic element output; and
    a second PNP anti-saturation transistor having a base coupled to said collector of said first transistor, a collector coupled to circuit ground and an emitter coupled to said base of said first transistor;
    said logic element structure being fabricated as a monolithic integration on a semiconductor crystal and comprising:

an isolated region of N-type semiconductor material having a generally rectangular solid shape including inner and outer principal faces and lateral faces, said region being bounded on its inner principal face by a substrate and by a buried layer of N+-type semiconductor material, said isolated region being bounded on its lateral faces by an insulating wall of P-type semiconductor material and being bounded on its principal outer face by a first region of P-type semiconductor material, this first region of P-type semiconductor material occupying the periphery of the isolated region and partially covering the insulating wall, said isolated region also being bounded on its principal outer face by a second region of P-type semiconductor material insulated from the first region of P-type semiconductor material by a minimum thickness of N-type semiconductor material, this second region of P-type semiconductor material surrounding a second region of N+-type semiconductor material, and an N+-type semiconductor region diffused into the insulating wall providing connection to an adjacent logic element said Schottky diode comprising and being formed by a metallization on the principal outer face of the isolated region between the first and second P-type semiconductor regions.

2. A logic element structure as claimed in claim 1, wherein the second N+-type region, the second P-type region and the N-type material which fills the isolated region respectively form the emitter, the base and the collector of the NPN transistor.

3. A logic element structure as claimed in claim 1, wherein the isolated region is in the form of an elongate paralleliped, the NPN transistor and the PNP anti-saturation transistor being aligned with the Schottky diodes along a first axis, interconnections with adjacent logic elements being established in the plane of the surface of the crystal by metallic layers along a second axis separate from the first.

4. A logic element structure as claimed in claim 1 wherein said N+-type semiconductor region diffused into the insulation wall is insulated by an insulated layer.

5. A logic element structure as claimed in claim 1 wherein the logic elements are interconnected by pricipal faces of their respective isolated regions, the NPN and PNP transistors of each logic element being fed through a lateral face of the isolated region by another PNP transistor serving as current source.

6. A logic element structure suitable for high density integration comprising:
a first NPN transistor having a base coupled to an input terminal of said logic element, an emitter coupled to circuit ground and a collector;
at least one Schottky diode coupled to said collector of said first NPN transistor and forming an output of said logic element structure; and
a second PNP anti-saturation transistor having a base coupled to said collector of said first transistor, a collector coupled to circuit ground and an emitter coupled to said base of said first transitor;
said logic element being formed as a monolithic integration on a semiconductor crystal and comprising:
a substrate;
a first region of N+-type semiconductor material at least partially buried within said substrate;
an insulating wall of P-type conductivity in contact with said substrate;

an isolated region of N-type semiconductor material having a generally rectangular solid shape including inner and outer principal faces and lateral faces, said region being bounded on its inner principal face by said substrate and by said buried layer and being bounded on its lateral faces by said insulting wall;
a first zone of P-type semiconductor material disposed on the outer principal face of said isolated region and partly covering said insulating wall;
a second region of P-type semiconductor material disposed on the outer principal face of said isolated region and insulated from said first P-type region of semiconductor material by a portion of said N-type isolated region;
a second region of N+-type semiconductor material diffused within said second P-type semiconductor region; and
a third N+-type semiconductor region diffused into the insulating wall providing connection to an adjacent logic element;
the Schottky diode being formed on the principal outer face of said isolated region between said two P-type regions.

7. A logic element structure according to claim 6 wherein said second region of N+-type semiconductor material, said second P-type region and said isolated region of N-type semiconductor material form the emitter, base, and collector, respectively, of said NPN transistor.

8. A logic element structure according to claim 6 wherein said isolated region of N-type semiconductor material is in the form of an elongate parallelepiped and wherein said NPN transistor and said PNP anti-saturation transistor are aligned with said Schottky diode along a first axis, interconnections with adjacent logic elements being established in the plane of the surface of the crystal by metallic layers along a second axis separate from said first axis.

9. A logic element structure according to claim 6 wherein crossings between metallic interconnections are formed by elongated regions of said third N+-type semiconductor region diffused into the thickness of said insulated wall and are insulated by an insulating layer.

10. A logic element structure according to claim 6 wherein logic elements are interconnected by principal faces of their respective isolated regions, the NPN and PNP transistors of each logic element being fed through a lateral face of the isolated region by another PNP transistor serving as a current source.

11. An integrated circuit, comprising:
a plurality of logic elements, each such logic element comprising:
a first NPN transistor having an emitter coupled to circuit ground, a collector and a base;
a Schottky diode coupled to said collector of said first transistor for providing a logic element output; and
a second PNP anti-saturation transistor having a base coupled to said collector of said first transistor, a collector coupled to circuit ground and an emitter coupled to said base of said first transistor;
said first and second transistors together comprising an isolated region of N-type semiconductor material having a generally rectangular solid shape including inner and outer principal faces and lateral faces, said region being bounded on its inner principal face by a substrate and by a buried layer of N+-type semiconductor material, said isolated region being bounded on its lateral faces by an insulating wall of P-type semiconductor material and being bounded on its principal outer face by a first a first region of P-type semiconductor material, this first region of P-type semiconductor material occupying the periphery of the isolated region and partially covering the insulating wall, said isolated region also being bounded on its principal outer face by a second region of P-type semiconductor material insulated from the first region of P-type semiconductor material by a minimum thickness of N-type seminconductor material, this second region of P-type semiconductor material surrounding a second region of N+-type semiconductor material, and said Schottky diode comprising and being formed by a metallisation on the principal outer face of the isolated region between the first and second P-type semiconductor regions; and an N+-type semiconductor region, of the same nature as the emitter of the NPN transistor, diffused into the insulating wall separting two adjacent logic elements, said diffused N+-type semiconductor region providing connections between said two adjacent logic elements through the wall, thereby enhancing integration density.

12. An integrated circuit according to claim 11 wherein the second N+-type region, the second P-type region and the N-type material which fills the isolated region respectively form the emitter, the base and the collector of the NPN transistor.

13. An integrated circuit according to claim 11 wherein the isolated region is in the form of an elongate paralleliped, the NPN transistor and the PNP anti-saturation transistor being aligned with the Schottky diodes along a first axis, interconnections with adjacent logic elements being established in the plane of the surface of the crystal by metallic layers along a second axis separate from the first.

14. An integrated circuit according to claim 11 wherein the logic elements are interconnected by principal faces of their respective isolated regions, the NPN and PNP transistors of each logic element being fed through a lateral face of the isolated region by another PNP transistor serving as current source.

15. An integrated circuit, comprising:
a plurality of logic elements, each logic element comprising
  a first NPN transistor having a base coupled to an input terminal of said logic element, an emitter coupled to circuit ground and a collector;
  at least one Schottky diode coupled to said collector of said first NPN transistor and forming an output of said logic element structure; and
  a second PNP anti-saturation transistor having a base coupled to said collector of said first transistor, a collector coupled to circuit ground and an emitter coupled to said base of said first transistor;
said transistors comprising a substrate; a first region of N+-type semiconductor material at least partially buried within said substrate; an insulating wall of P-type conductivity in contact with said substrate; and isolated region of N-type semiconductor material having a generally rectangular solid shape including inner and outer principal faces and lateral faces, said region being bounded on its inner principal face by said substrate and by said buried layer and bounded on its lateral faces by said insulating wall; a first zone of P-type semiconductor material disposed on the outer principal face of said isolated region and partly covering said insulating wall; a second region of P-type semiconductor material disposed on the outer principal face of said isolated region and insulated from said first P-type region of semiconductor material by a portion of said N-type isolated region; a second region of N+-type semiconductor material diffused within said second P-type semiconductor region; and wherein
the Schottky diode is formed on the principal outer face of said isolated region between said two P-type regions; and
an N+-type semiconductor region, of the same nature as the emitter of the NPN transistor, diffused into the insulating wall separating two adjacent logic elements, said diffused N+-type semiconductor region providing connections between said two adjacent logic elements through the wall, thereby enhancing integration density.

16. An integrated circuit according to claim 15 wherein said second region of N+-type semiconductor material, said second P-type region and said isolated region of N-type semiconductor material form the emitter, base, and collector, respectively, of said NPN transistor.

17. An integrated circuit according to claim 15 wherein said isolated region of N-type semiconductor material is in the form of an elongate parallelpiped and wherein said NPN transistor and said PNP anti-saturation transistor are aligned with said Schottky diode along a first axis, interconnections with adjacent logic elements being established in the plane of the surface of the crystal by metallic layers along a second axis separate from said first axis.

18. An integrated circuit according to claim 15 wherein logic elements are interconnected by principal faces of their respective isolated regions, the NPN and PNP transistors of each logic element being fed through a lateral face of the isolated region by another PNP transistor serving as a current source.

* * * * *